United States Patent [19]
Parayanthal et al.

[11] Patent Number: 6,057,954
[45] Date of Patent: May 2, 2000

[54] ASYMMETRIC INDUCTIVE PEAKING FOR OPTOELECTRONIC DEVICES

[75] Inventors: Padman Parayanthal, Clinton Township, N.J.; Gleb E. Shtengel, Upper Milford Township, Pa.

[73] Assignee: Lucent Technologies Inc., Murray Hill, N.J.

[21] Appl. No.: 09/157,239

[22] Filed: Sep. 18, 1998

[51] Int. Cl.[7] .............................. G02F 1/03; G02B 26/00; G02B 6/12; H01S 3/00
[52] U.S. Cl. .......................... 359/248; 359/237; 359/238; 385/14; 372/38
[58] Field of Search .................................... 359/237, 238, 359/245, 248, 180, 188; 385/14; 372/81.82, 33, 38

[56] References Cited

U.S. PATENT DOCUMENTS

| | | | |
|---|---|---|---|
| 5,602,672 | 2/1997 | Ishimura et al. | 359/245 |
| 5,781,578 | 7/1998 | Takagi | 372/50 |

FOREIGN PATENT DOCUMENTS

| | | |
|---|---|---|
| 97-246633 | 3/1996 | Japan . |
| 97078124 | of 1997 | Japan . |
| 97-247092 | 9/1997 | Japan . |
| 97-252164 | 9/1997 | Japan . |

*Primary Examiner*—Georgia Epps
*Assistant Examiner*—David N. Spector

[57] ABSTRACT

An optoelectronic device, such as an electro-absorption modulator laser (EML), is configured to a submount using an asymmetric inductive peaking scheme in which a first wire connects a modulator signal electrode on the submount to the modulator contact pad on the device and a second wire connects the modulator contact pad to an integrated resistor on the submount, where the first and second wires have substantially different inductances. Such asymmetric inductive peaking improves the high-frequency performance of the resulting packaged device by providing a higher transmission coefficient and a lower return loss at high frequencies than devices configured using conventional symmetric inductive peaking in which the inductances of the two connecting wires are purposely designed to be equal. In one embodiment, in which the device will be modulated by a standard 50-ohm electrical signal generator, the integrated resistor is a 50-ohm device, the first wire is kept as short as practicable (e.g., about 0.3 mm) and the second wire is made as long as practicable (e.g., about 1.5 mm). The resulting packaged devices show good high-frequency performance for a wide range of device parameters.

18 Claims, 10 Drawing Sheets

ASYMMETRIC INDUCTIVE PEAKING FOR OPTOELECTRONIC DEVICES

BACKGROUND OF THE INVENTION

1. Field of the Invention

The present invention relates to electro-optics, and, in particular, to the configuration of optoelectronic devices such as electro-absorption modulated lasers for packaging and use, for example, in optical communication systems.

2. Description of the Related Art

An electro-absorption modulated laser (EML) is an integrated device having a laser portion that converts an electrical signal into an optical light signal and a modulator portion that modulates the optical signal generated by the laser portion based on electrical signals received from an electrical signal generator, e.g., to encode information into the optical signal for transmission over an optical fiber in an optical communication system. In order to reduce return loss due to electrical reflections, it is important match the output impedance of the electrical signal generator to the input impedance of the EML device.

FIG. 1 shows a schematic diagram of a conventional configuration of an EML device 102 mounted onto a submount 104 and ready for assembly as a packaged device. As shown in FIG. 1, submount 104 has a modulator signal electrode 106 to which an electrical signal generator is to be connected and a ground electrode 108 with an integrated resistor 110, while EML device 102 has a modulator contact pad 112 located adjacent to the modulator portion of the EML device. According to a conventional wiring configuration, modulator signal electrode 106 is connected to modulator contact pad 112 by a first wire 114, and modulator contact pad 112 is in turn connected to integrated resistor 110 of ground electrode 108 by a second wire 116. With this wiring configuration, modulator signal electrode 106 can be connected to an external electrical signal generator (not shown) to drive the modulator portion of EML device 102.

Standard electrical signal generators for EML devices, such as EML device 102 of FIG. 1, have a 50-ohm output impedance. As shown in FIG. 1, integrated resistor 110, which also has a 50-ohm impedance, is connected between modulator contact pad 112 and ground electrode 108 in order to match the impedances between EML device 102 and a standard electrical signal generator. Wires 114 and 116 add inductances to the circuitry that can affect the high-frequency performance of the final packaged device. In conventional configuration schemes, wires 114 and 116 are purposely selected to be the same length (e.g., 1.25 millimeters), so that the inductances added to the resulting circuit by the two wires will have the same magnitude (e.g., 1.25 nanohenries (nH), where standard gold wiring adds about 1 nH of inductance for every 1 mm of length). Such a wiring scheme may be referred to as symmetric inductive peaking, since the wiring is attached in a symmetric manner that keeps inductance levels the same in an attempt to optimize the performance of the resulting packaged device.

SUMMARY OF THE INVENTION

The present invention is directed to a wiring scheme that improves the high-frequency performance of packaged optoelectronic devices, such as EML devices, as compared to those configured using the symmetric inductive peaking scheme of the prior art. According to the present invention, the two wires used to connect the modulator contact pad of an optoelectronic device to the modulator signal electrode and the ground resistor of a submount are purposely selected to contribute different levels of inductance to the resulting circuitry of the packaged device. It has been found that adding different levels of inductance to the resulting circuit can improve the high-frequency performance of a packaged device as compared to similar devices configured using a wiring scheme based on the symmetric inductive peaking of the prior art. The wiring scheme of the present invention may be referred to as asymmetric inductive peaking, since the wiring is purposely added in an asymmetric manner that keeps inductance levels different in an attempt to optimize the performance of the resulting packaged device.

In particular, the present invention is an optoelectronic device mounted onto a submount, wherein a first wire connects a modulator signal electrode on the submount to a modulator contact pad on the optoelectronic device, and a second wire connects the modulator contact pad to an integrated resistor on the submount, wherein the inductance associated with the first wire is substantially different from the inductance associated with the second wire.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

Figure 2:
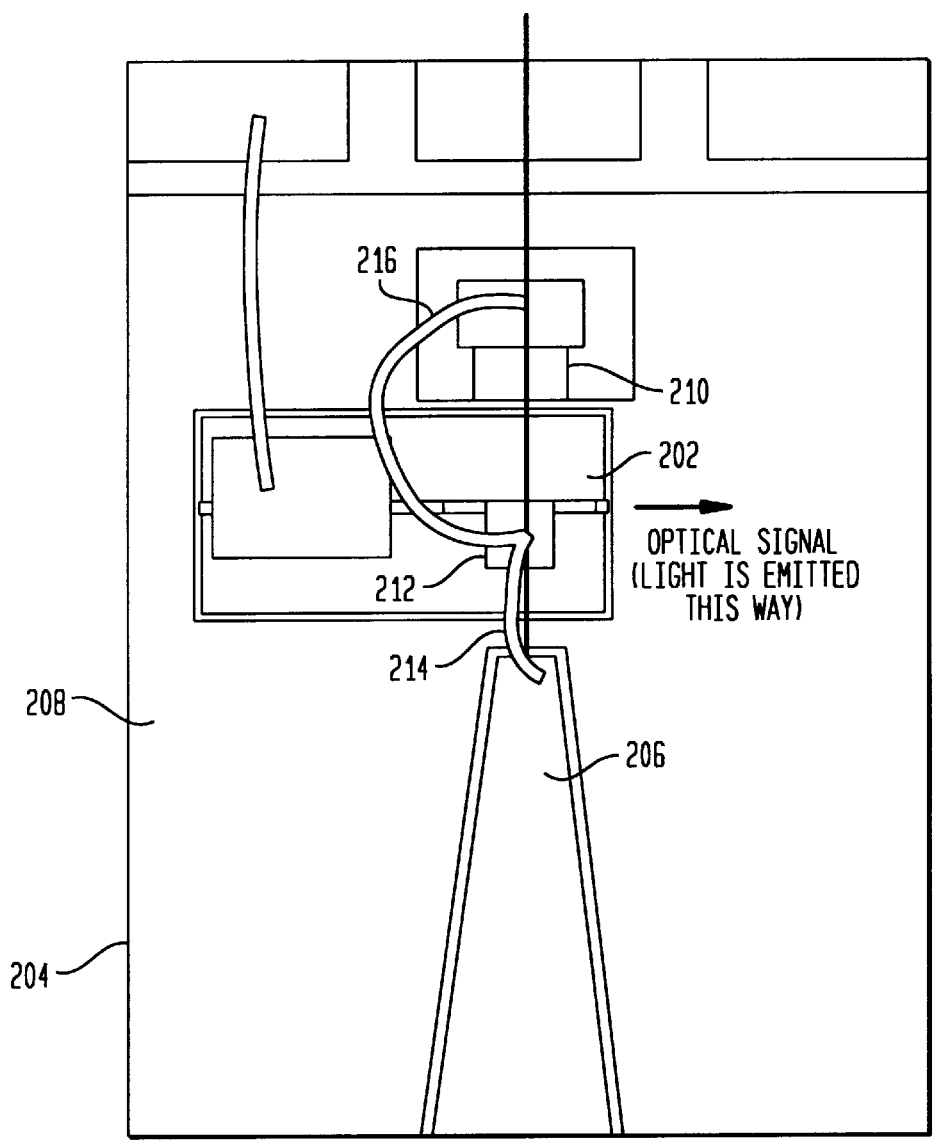
FIG. 2 shows a schematic diagram of the configuration of an EML device mounted onto a submount and ready for assembly as a packaged device, according to one embodiment of the present invention.
Figure 4A:
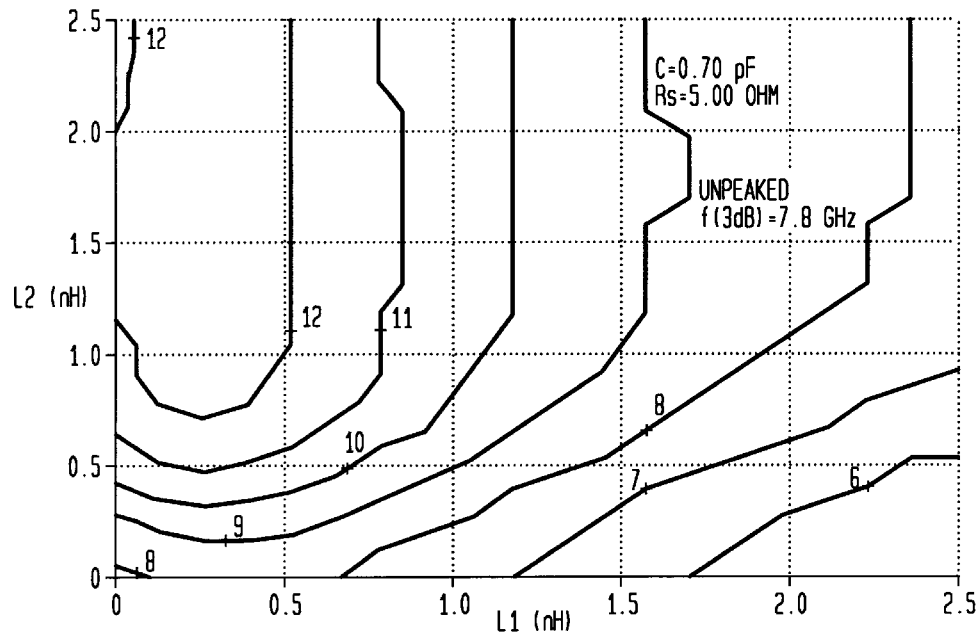
FIGS. 4A–F show contour plots for six different sets of EML device parameters, where each curve in contour plot represents the different combinations of values for the bonding wire inductances $L_1$ and $L_2$, in FIG. 3 that achieve the same small-signal bandwidth.
Figure 4B:
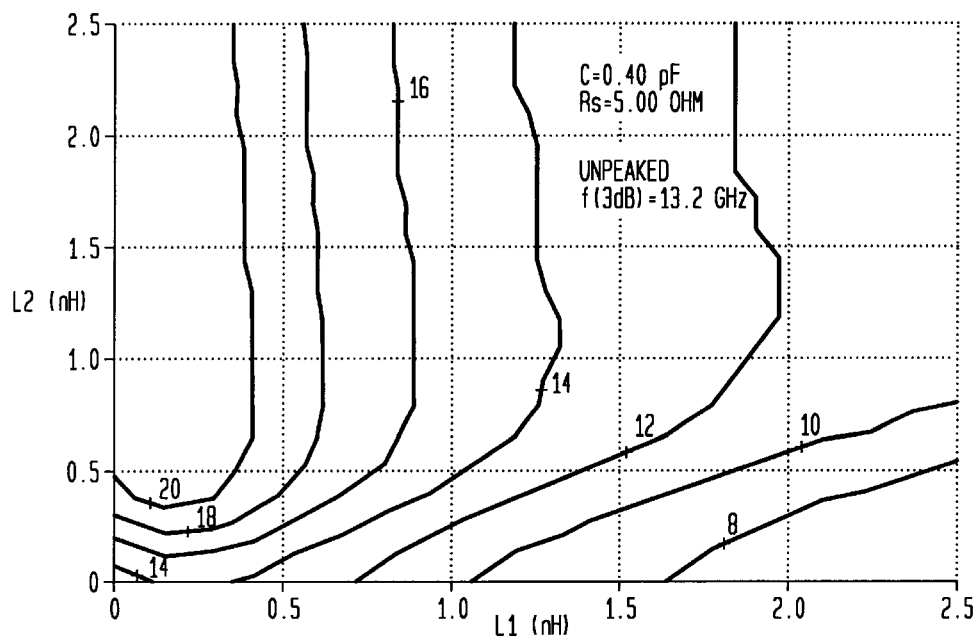
Figure 4C:
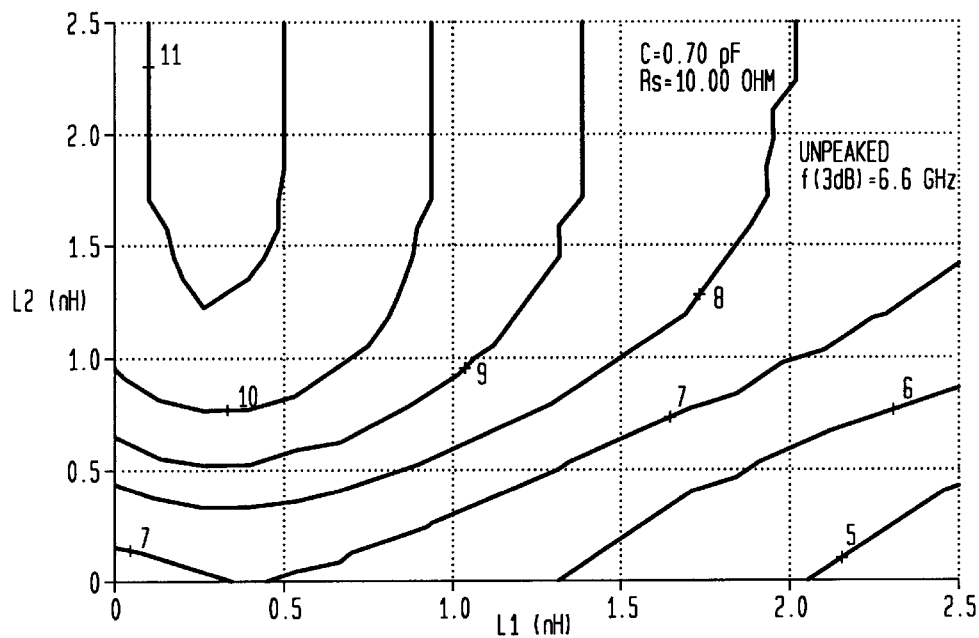
Figure 4D:
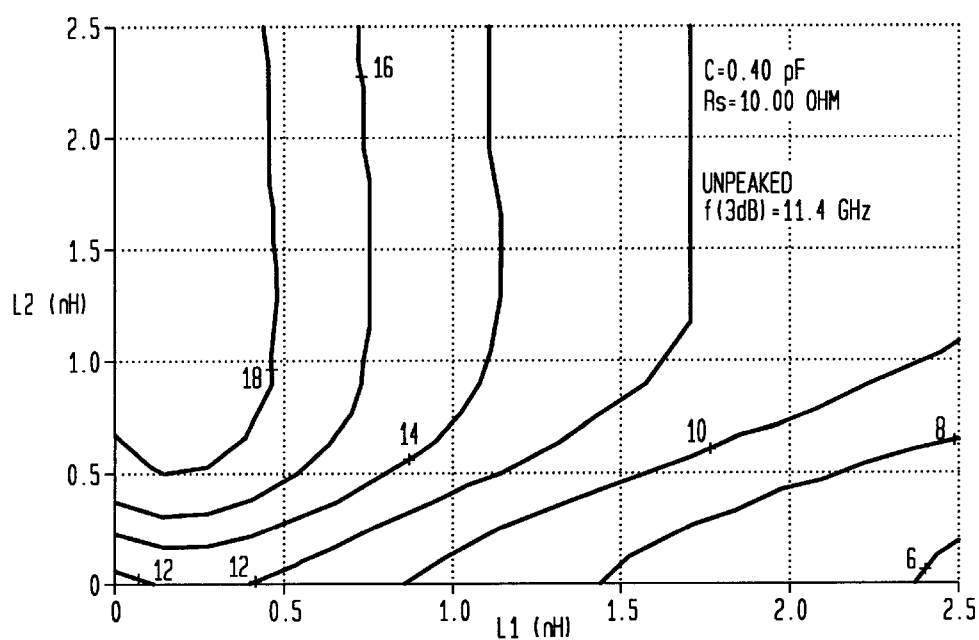
Figure 4E:
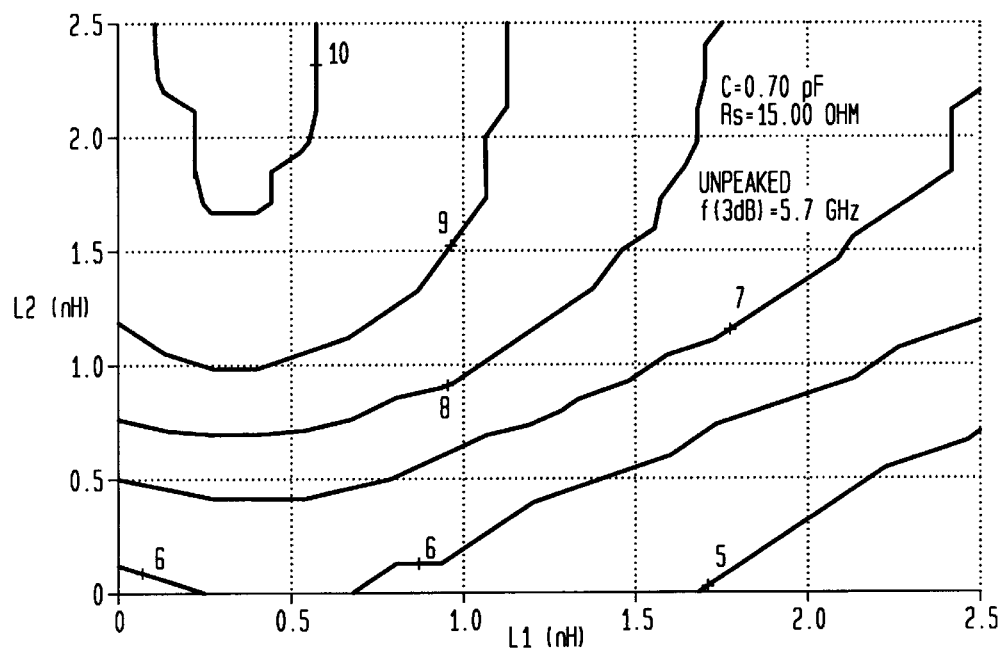
Figure 4F:
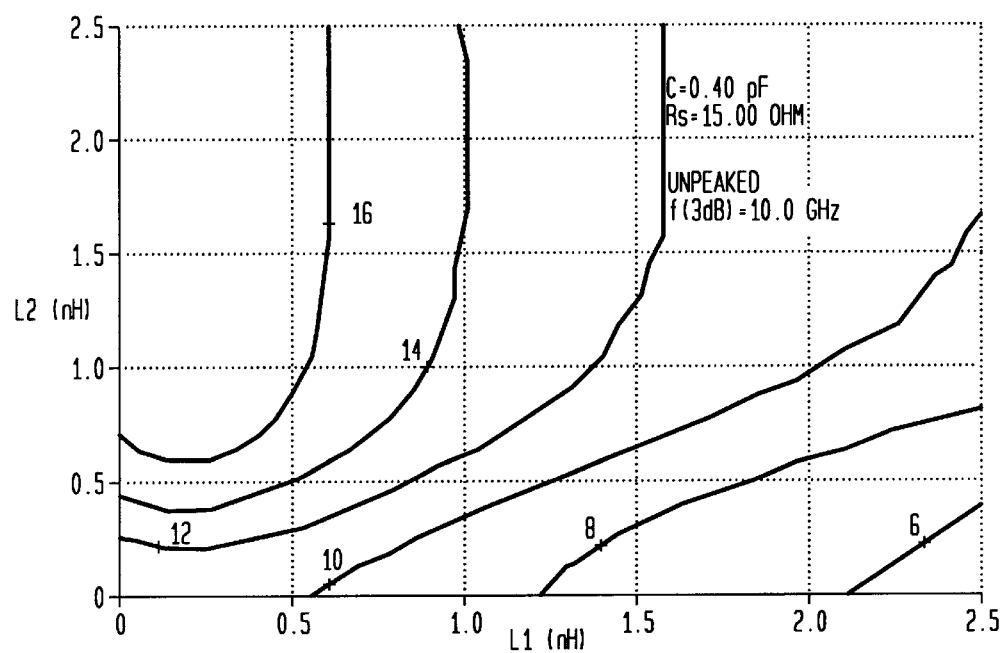

FIG. 2 shows a schematic diagram of the configuration of an electro-absorption modulated laser 202 mounted onto a submount 204 and ready for assembly as a packaged device, according to one embodiment of the present invention. According to the present invention, the wiring scheme used to configure modulator contact pad 212 of EML device 202 to modulator signal electrode 206 and to 50-ohm integrated resistor 210 is based on asymmetric inductive peaking, in which the inductances contributed by wires 214 and 216 are different. In one embodiment of the present invention, the different levels of inductance for the two wires are achieved by using different lengths of the same type of gold wire. For example, in one particular implementation, wire 214 connecting modulator signal electrode 206 and modulator contact pad 212 is about 0.3 mm long and adds about 0.3 nH of inductance to the resulting circuit of the packaged device, while wire 216 connecting modulator contact pad 212 and integrated resistor 210 is at least about 1.5 mm long to add at least about 1.5 nH of inductance to the resulting circuit. Such asymmetric inductive peaking has been found to improve the high-frequency performance of the resulting packaged EML devices.

Figure 1:
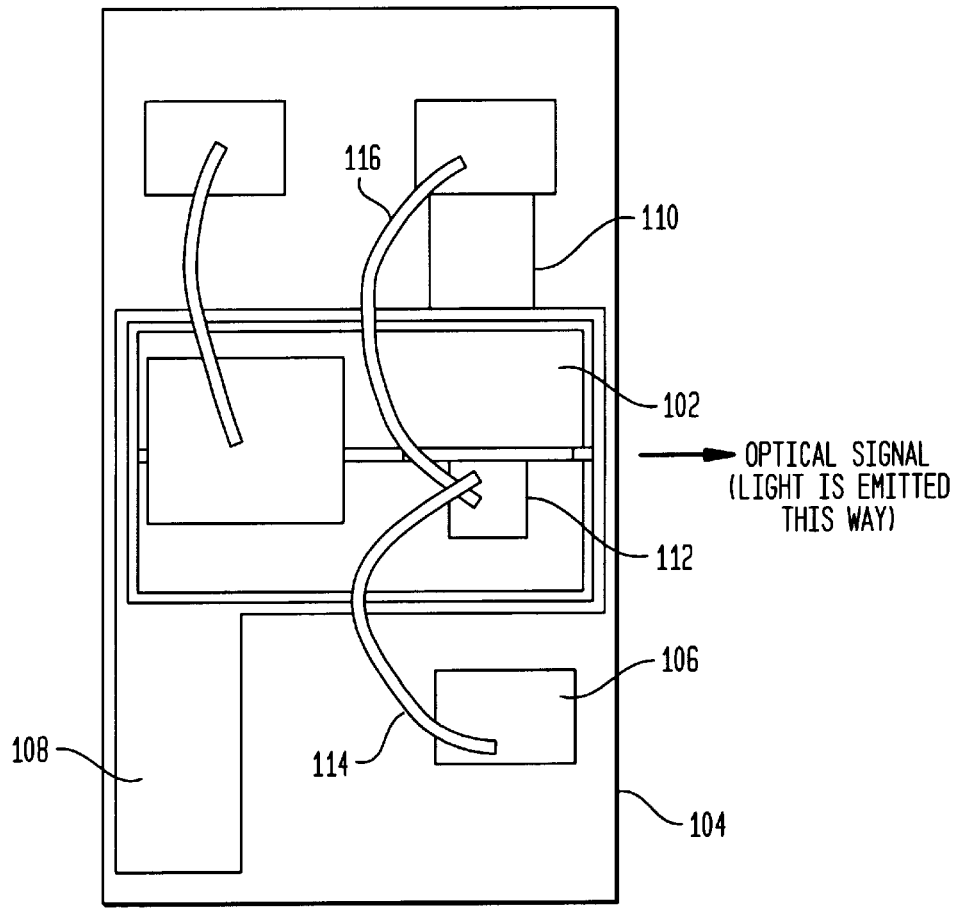
FIG. 1 shows a schematic diagram of a conventional configuration of an EML device mounted onto a submount and ready for assembly as a packaged device.
Figure 3:
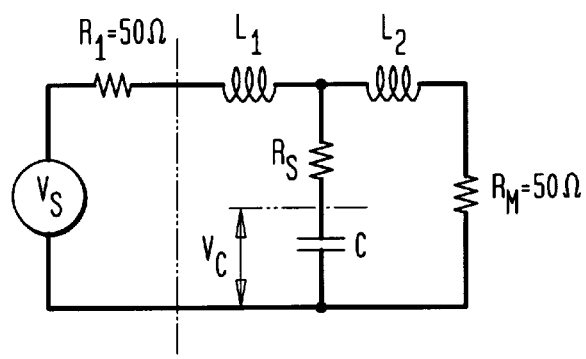
FIG. 3 shows a schematic diagram of a simplified equivalent circuit for a packaged EML device, such as the EML device of FIG. 2, configured to a standard 50-ohm electrical signal generator using the wiring scheme of the present invention.

FIG. 3 shows a schematic diagram of a simplified equivalent circuit for a packaged EML device, such as EML device 202 of FIG. 2, configured to a standard 50-ohm electrical signal generator using the wiring scheme of the present invention. In FIG. 3, the electrical signal generator is represented by a high-frequency voltage supply $V_S$ and a 50-ohm resistor $R_1$, the impedance of the modulator portion of EML device 202 is represented by a capacitor C and a series resistor $R_S$, wire 214 of FIG. 2 is represented by an inductor $L_1$, wire 216 is represented by an inductor $L_2$, and resistor 210 is represented by a 50-ohm resistor $R_m$.

Using complex impedance analysis, the total impedance as seen by the electrical signal generator is given by Equation (1) as follows:

$$Z(\omega) = j\omega L_1 + \left[\left(R_s + \frac{1}{j\omega C}\right)^{-1} + \left(j\omega L_2 + R_m^{-1}\right)\right]^{-1} \quad (1)$$

where the circular frequency is proportional to standard frequency: $\omega = 2\pi f$. The reflection coefficient $S_{11}$ between the electrical signal generator and the packaged EML device is given by Equation (2) as follows:

$$S_{11} = 20\log_{10}\left|\frac{Z - R_1}{Z + R_1}\right| \quad (2)$$

while the corresponding transmission coefficient $S_{21}$ is given by Equation (3) as follows:

$$S_{21} = 20\log_{10}\left|\frac{2V_c}{V_s}\right| \quad (3)$$

where $V_c$ is the voltage across capacitor C in FIG. 3. In an ideal configuration, the reflection coefficient $S_{11}$, which represents the magnitude of the return loss, is minimized, while the transmission coefficient $S_{21}$, which represents the magnitude of the transmitted signal, is maximized. The frequency at which the transmission coefficient $S_{21}$ drops by 3 dB from its DC value is referred to herein as the small-signal bandwidth. One goal of the present invention is to maximize the small-signal bandwidth.

Small-Signal Bandwidth Simulation Results

Simulations were performed using Equations (1)–(3) to determine the small-signal bandwidth of a packaged EML device by varying the values of both inductances $L_1$ and $L_2$ in order to find the optimum range for various values of EML device parameters C and $R_S$. The values for the modulator capacitance C and the modulator series resistance $R_S$ were varied to reflect the inherent variations that occur from device to device during manufacturing.

FIGS. 4A–F shows contour plots for the six different sets of EML device parameters listed in Table I. Each curve in each contour plot represents the different combinations of values for the bonding wire inductances $L_1$ and $L_2$ of FIG. 3 that achieve the same small-signal bandwidth. For example, in FIG. 4A, the curve labeled "10" corresponds to those combinations of $L_1$ and $L_2$ whose small-signal bandwidth is 10 gigahertz (GHz). The fourth column in Table I identifies the small-signal bandwidth for the equivalent "unpeaked" EML device (i.e., where $L_1$ and $L_2$ are both zero), and the last column identifies the small-signal bandwidth for the equivalent EML device with an asymmetrical inductive peaking configuration corresponding to $L_1=0.3$ nH and $L_2=1.5$ nH.

TABLE I

| FIG. | C (picofarads) | $R_s$ (ohms) | Unpeaked B/W (GHz) ($L_1 = L_2 = 0$) | Peaked B/W (GHz) ($L_1 = 0.3$ nH and $L_2 = 1.5$ nH) |
|---|---|---|---|---|
| 4A | 0.7 | 5 | 7.8 | 12.5 |
| 4B | 0.4 | 5 | 13.2 | 20.8 |
| 4C | 0.7 | 10 | 6.6 | 11.2 |
| 4D | 0.4 | 10 | 11.4 | 19.2 |
| 4E | 0.7 | 15 | 5.7 | 10.0 |
| 4F | 0.4 | 15 | 10.0 | 17.8 |

FIGS. 4A–F confirm that the small-signal bandwidth is RC-limited and that EML devices with smaller capacitance will have higher small-signal bandwidths. These bandwidths can be substantially increased (by almost a factor of 2) using inductive peaking. The simulation results also indicate that the conventional configuration scheme based on symmetric inductive peaking, in which $L_1$ and $L_2$ are purposely selected to be equal, does not provide the highest small-signal bandwidth. Rather, a configuration scheme based on asymmetric inductive peaking, in which $L_1$ and $L_2$ are purposely selected to be different, provides better high-frequency performance.

Moreover, for a wide range of device parameters (i.e., C=0.4–0.7 pF and $R_S$=5–15 ohms), a single choice of bond-wire inductances (e.g., $L_1$=0.3 nH±0.15 nH and L=1.5 nH±0.3 nH) provides good small-signal bandwidth results. This implies that asymmetric inductive peaking can be applied without having to pre-screen the device parameters in the production environment to determine what lengths of wires to use for each device. Rather, a single set of lengths can be used to configure all EML devices of a given type. The simulation results suggest that the first wire (i.e., wire 214 in FIG. 2) should be as short as possible (e.g., 0.3 mm±0.15 mm) and the second wire (i.e., wire 216 in FIG. 2) should be as long as reasonably possible (e.g., 1.5 mm±0.3 mm).

Instead of changing the length of a wire, another way to achieve different inductance levels is to vary the size of the wire. Since inductivity is inversely proportional to the diameter of a wire and directly proportional to the length, a wire with a smaller diameter can be used instead of using a longer wire to achieve greater inductivity levels.

Small-Signal Bandwidth Experimental Results

Figure 5:
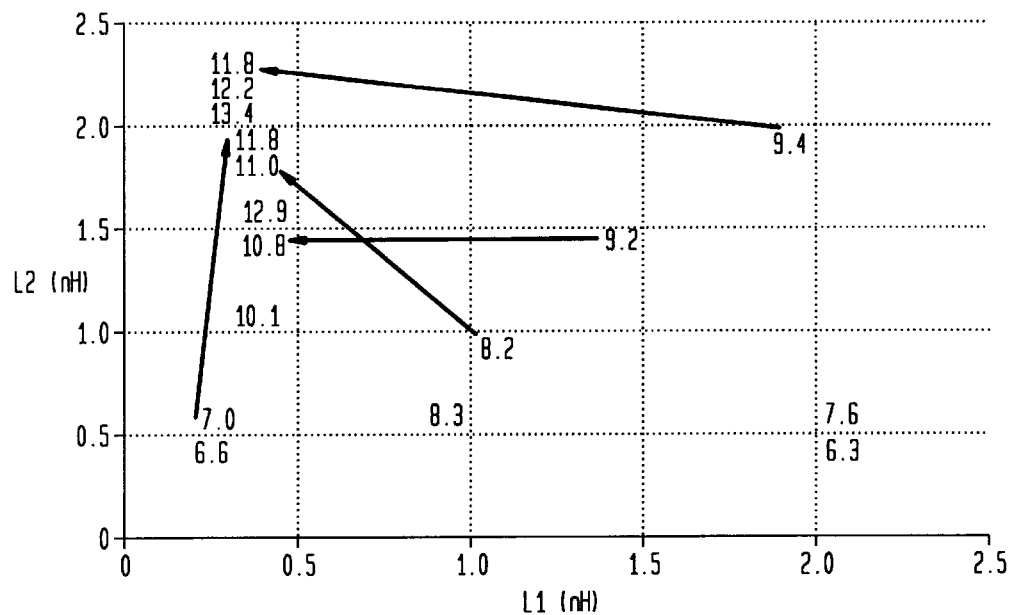
FIG. 5 shows the small-signal bandwidths for a number of pre-bond tested 10 Gb/s EML devices that were mounted on high-speed submounts and bonded with various bond-wire lengths.

FIG. 5 shows the small-signal bandwidths for a number of pre-bond tested 10 Gb/s EML devices that were mounted on high-speed submounts and bonded with various bond-wire lengths. The accuracy of the determination of the bond-wire length is about 0.2 mm. The wire used for bonding was a gold ribbon with a cross-section of (3×0.5) mills, which has an inductance of about 1 nH/mm as measured on a dummy substrate. The small-signal bandwidths of the EML devices were measured using an HP8510C network analyzer. Some of the EML devices were re-bonded with different bond-wire lengths in an attempt to study the effect of the bond-wire length on the same device. These results are indicated in FIG. 5 by arrows connecting different small-signal bandwidth values.

Figure 6:
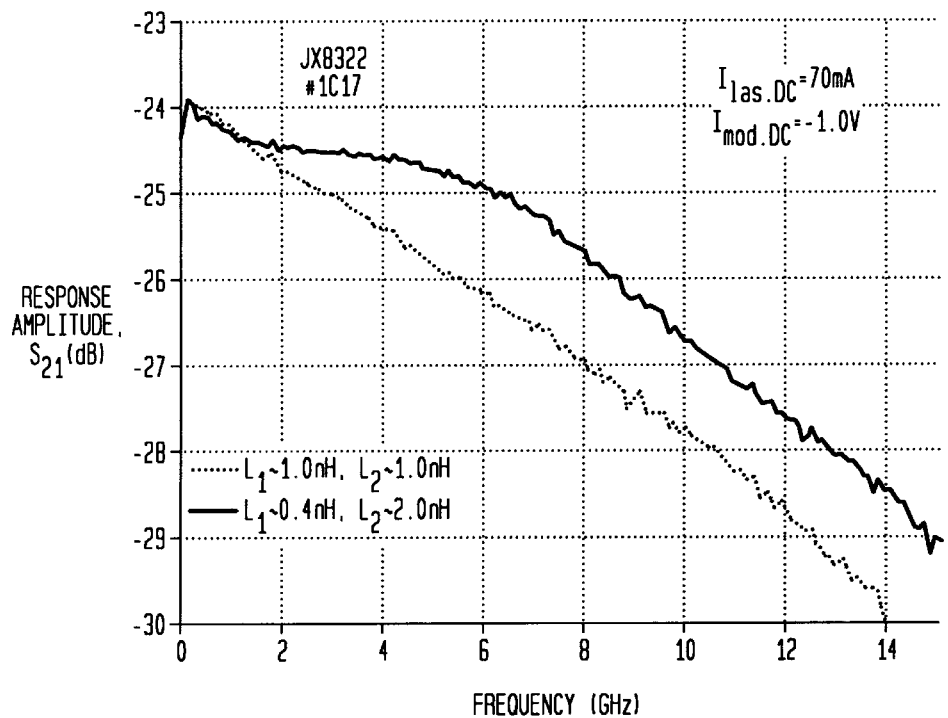
FIG. 6 shows the amplitude response of a particular EML device as a function of frequency, bonded first in a symmetric inductive peaking configuration (i.e., $L_1 \approx L_2 \approx 1.0$ nH) and then re-bonded in an asymmetric inductive peaking configuration (i.e., $L_1 \approx 0.4$ nH, $L_2 \approx 2.0$ nH)
Figure 7A:
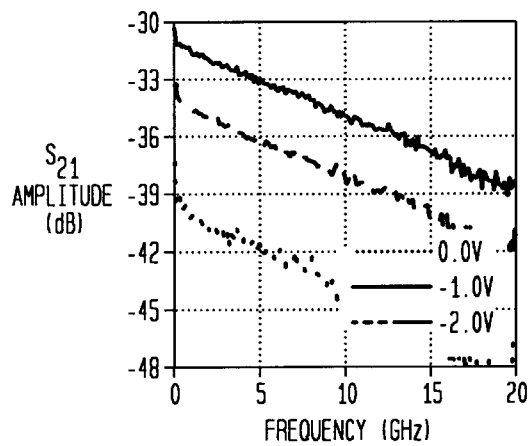
FIGS. 7A–B and 8A–B show the amplitude and phase of the modulation response as functions of modulation frequency for the same EML device both without (FIGS. 7A–B) and with (FIGS. 8A–B) asymmetric inductive peaking, respectively.
Figure 7B:
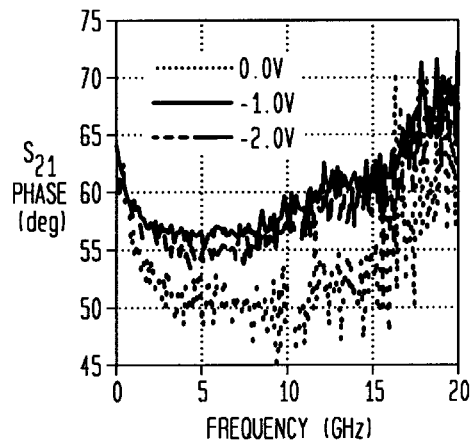
Figure 8A:
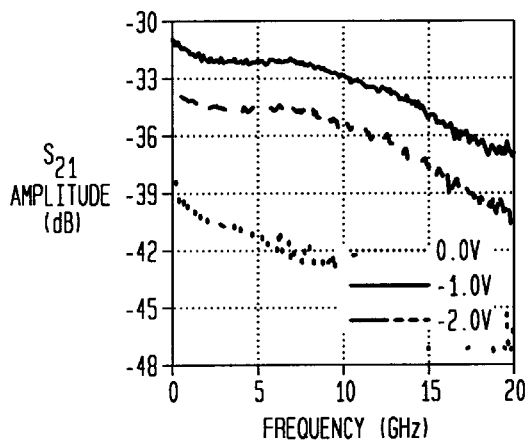
Figure 8B:
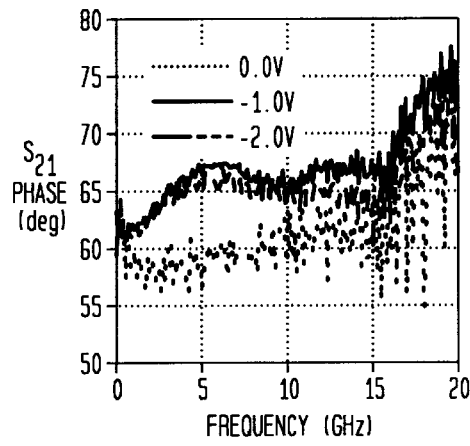

FIG. 6 shows the amplitude response of a particular EML device as a function of frequency, bonded first in a symmetric inductive peaking configuration (i.e., $L_1 \approx L_2 \approx 1.0$ nH) and then re-bonded in an asymmetric inductive peaking configuration (i.e., $L_1 \approx 0.4$ nH, $L_2 \approx 2.0$ nH). As shown in FIG. 6, with asymmetric inductive peaking as in the present invention, the response curve is flattened in a low-frequency range. The low-frequency roll-off, which is most probably associated with a larger low-frequency capacitance, is not compensated by the asymmetric inductive peaking, because inductive peaking has a strong effect only around the value of a high-frequency pole of the complex total impedance of the packaged EML device. Even in this case, however, the asymmetric inductive peaking increases the small-signal bandwidth by about 3 GHz.

Phase Response Measurements

FIGS. 7A–B and 8A–B show the amplitude and phase of the modulation response as functions of modulation frequency for the same EML device with essentially no peaking (i.e., $L_1 \approx L_2 \approx 0.2$ nH) (FIGS. 7A–B) and with asymmetric inductive peaking (i.e., $L_1 \approx 0.3$ nH, $L_2 \approx 1.5$ nH) (FIGS. 8A–B), respectively. For this particular EML device, the small-signal bandwidth was about 9 GHz with no peaking and about 14 GHz with asymmetric inductive peaking. These results, along with similar results for other EML devices, indicate that the asymmetric inductive peaking scheme of the present invention improves the modulation bandwidth considerably (e.g., from 9 GHz to 14 GHz) without producing any significant distortion of the response phase. For example, in FIGS. 7B and 8B, the response phase differs by as much as about 5–10 degrees over the frequency range of 0–10 GHz, which is close to the experimental measurement accuracy.

Reflection Coefficient: Modeling and Experimental Results

Figure 9:
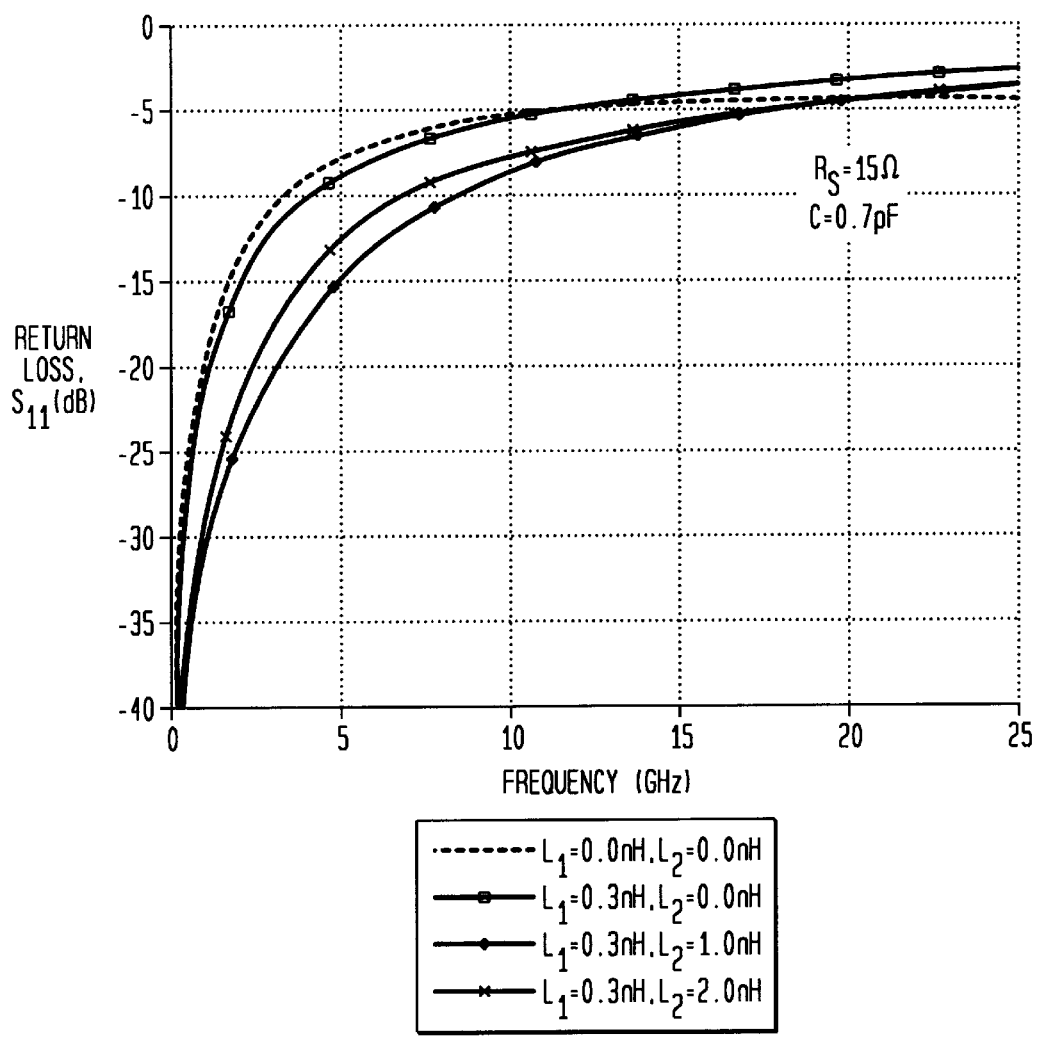
FIG. 9 shows the return loss or reflection coefficient $S_{11}$ of a packaged EML device as a function of frequency for four different combinations of inductances $L_1$ and $L_2$.

FIG. 9 shows the return loss or reflection coefficient $S_{11}$ for a packaged EML device as a function of frequency calculated based on Equations (1) and (2) for four different combinations of inductances $L_1$ and $L_2$ for a modulator capacitance C of 0.7 pF and a modulator series resistance $R_S$ of 15 ohms. In the frequency range of interest (i.e., 0–10 GHz), all of the inductive peaking configurations perform better relative to the unpeaked scheme. The optimal range is $L_1 \approx 0.3$ nH and $L_2$ between about 1.5 and 2.0 nH, which is also very close to the optimal range for maximizing the small-signal bandwidth (i.e., $S_{21}$ of Equation (3)).

As shown in FIG. 9, the value of the return loss $S_{11}$ for the optimal peaked schemes is lower than that for the unpeaked scheme for frequencies up to about 20 GHz, above which the peaked configurations exhibit higher return loss. However, for 10 Gb/s applications, this is not important, whereas the decreased value of $S_{11}$ in the signal frequency range of interest improves the device performance by reducing the standing wave between the EML device and the electrical signal generator.

Figure 10A:
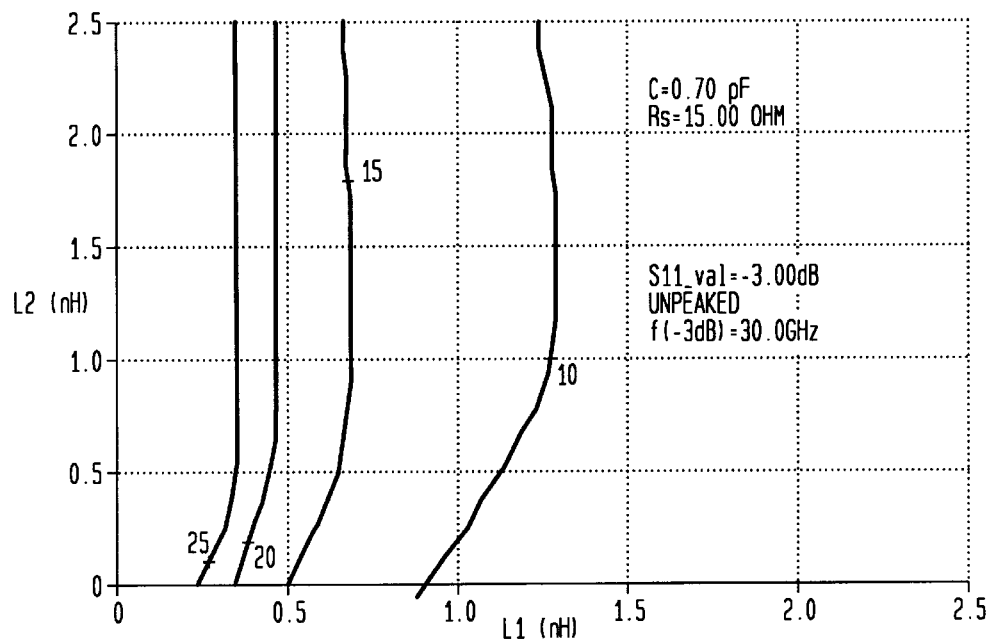
FIGS. 10A and 10B show contour plots of EML device return loss $S_{11}$ at the −6 dB and −3 dB frequencies, respectively, for the same device parameters as in FIG. 9.
Figure 10B:
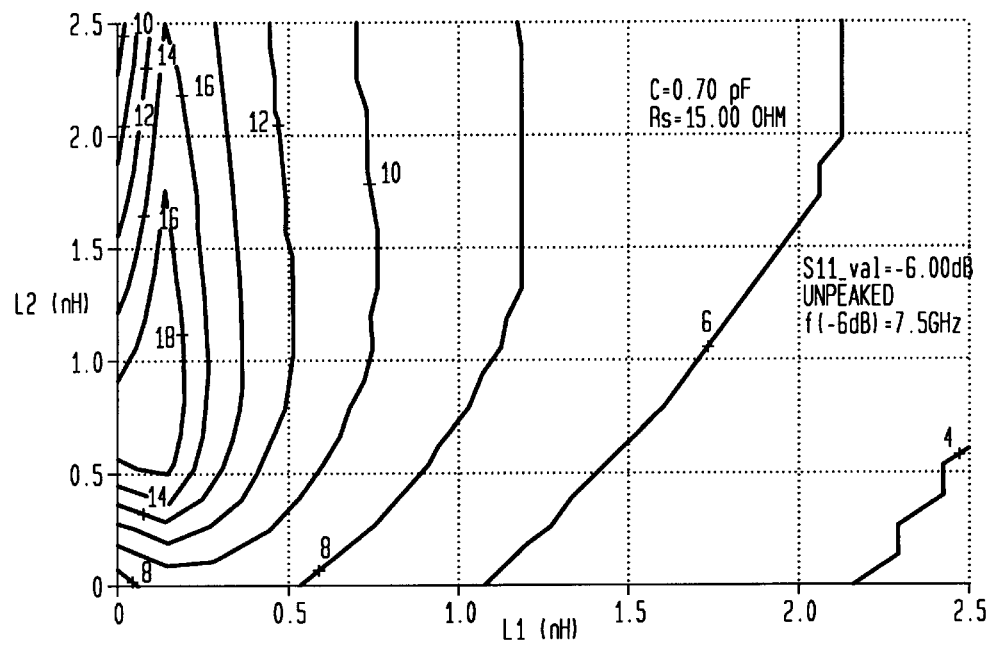

FIGS. 10A and 10B show contour plots of EML device return loss $S_{11}$ at the −6 dB and −3 dB frequencies, respectively, for the same device parameters as in FIG. 9. The results shown in FIGS. 4A–F and 10A–B indicate that the configuration for the highest small-signal bandwidth (FIGS. 4A–F) and the configuration for the lowest return loss (FIGS. 10A–B) are not the same. In other words, the configurations are located at different points in the two-dimensional bond-wire inductance space. As such, an EML device cannot be simultaneously optimized for both small-signal bandwidth and return loss. This is due to the presence of the elements $L_1$ and $R_S$ in the equivalent circuit of FIG. 3. Nevertheless, the two optimal configurations are sufficiently close to one another, so that choosing the optimal configuration based on small-signal bandwidth (i.e., the more critical parameter) also reduces the return loss coefficient.

Figure 11:
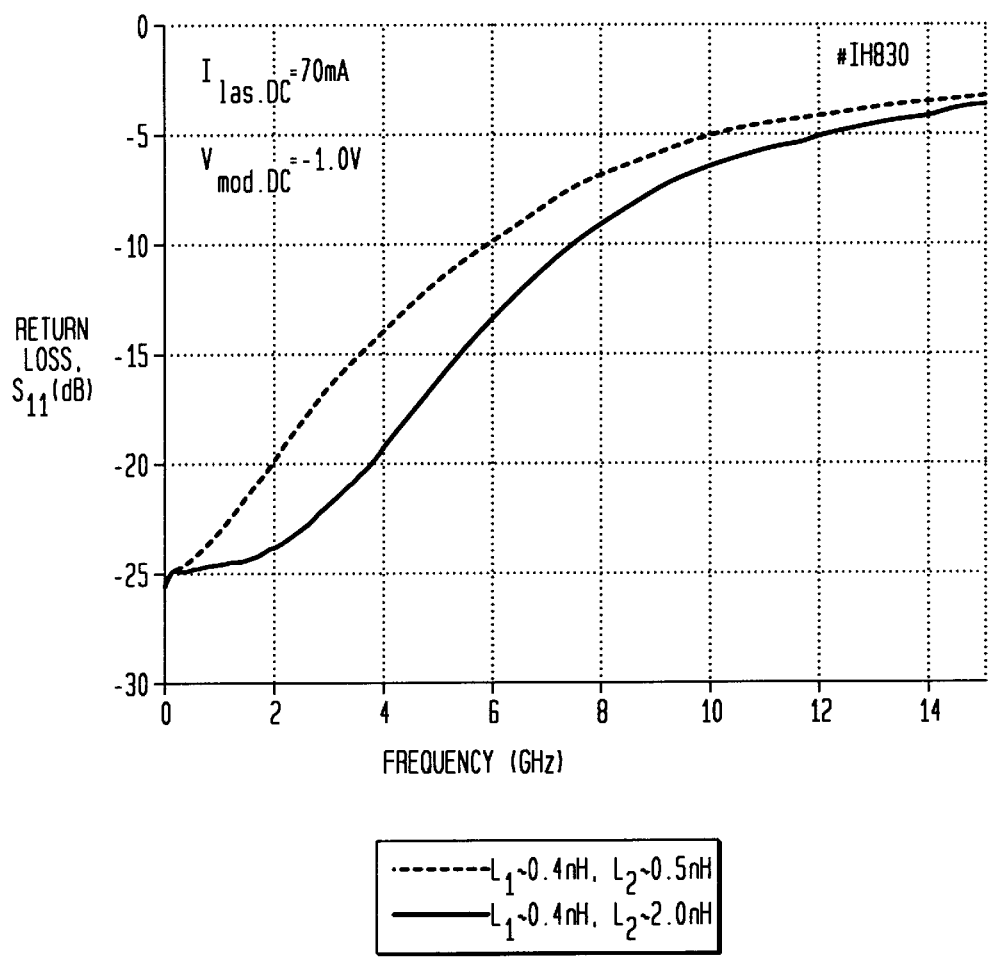
FIG. 11 shows experimental results of the return loss $S_{11}$ as a function of modulation frequency for a particular EML device configured with two different inductive peaking schemes.

FIG. 11 shows experimental results of the return loss $S_{11}$ as a function of modulation frequency for a particular EML device configured with two different inductive peaking schemes. The signature of the pole in the impedance is clearly observed in the configuration scheme with the more highly asymmetric inductive peaking (i.e., $L_1 \approx 0.4$ nH, $L_2 \approx 2.0$ nH). This inductive peaking scheme also reduces the return loss curve over the entire range of measurement. Although the curves will cross at a frequency of about 20 GHz, above which the more highly asymmetric case will have worse performance, this is not relevant for 10 Gb/s applications.

The simulation and experimental results discussed in the previous sections demonstrate the efficacy of using an asymmetric inductive peaking scheme for configuring and packaging EML devices. In particular, the small-signal bandwidth can be significantly increased (by almost a factor of 2) using an optimal asymmetric inductive peaking scheme in which $L_1 \approx 0.3$ nH and $L_2 \geq 1.5$ nH for a wide range of values for C and $R_S$. The amount of peaking under such a scheme does not produce any significant distortion of the response phase. Due to the presence of elements $L_1$ and $R_S$, the optimal inductive peaking scheme for minimizing the reflection coefficient $S_{11}$ is different from the optimal inductive peaking scheme for maximizing the transmission coefficient $S_{21}$. Nevertheless, the optimal inductive peaking scheme for maximizing the transmission coefficient $S_{21}$ does provide some reduction in the return loss as compared to the symmetric inductive peaking of the prior art.

Although the present invention has been described in the context of packaged EML devices, those skilled in the art will understand that the asymmetric inductive peaking of the present invention can be applied to other types of optoelectronic devices, such as a Mach-Zehnder modulator.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An optoelectronic device mounted onto a submount, wherein:
    a first wire connects a modulator signal electrode on the submount directly to a modulator contact pad on the optoelectronic device without any intermediate bonding pad relaying; and
    a second wire connects the modulator contact pad to an integrated resistor on the submount, wherein the inductance associated with the first wire is substantially different from the inductance associated with the second wire.

2. The invention of claim 1, wherein the length of the first wire is substantially different from the length of the second wire.

3. The invention of claim 1, wherein the length of the first wire is less than the length of the second wire.

4. The invention of claim 3, wherein the length of the first wire is less than or equal to about 0.45 mm and the length of the second wire is greater than or equal to about 1.2 mm.

5. The invention of claim 4, wherein the length of the first wire is about 0.3 mm and the length of the second wire is about 1.5 mm.

6. The invention of claim 1, wherein the inductance of the first wire is less than the inductance of the second wire.

7. The invention of claim 6, wherein the inductance of the first wire is less than or equal to about 0.45 nH and the inductance of the second wire is greater than or equal to about 1.2 nH.

8. The invention of claim 7, wherein the inductance of the first wire is about 0.3 nH and the inductance of the second wire is about 1.5 nH.

9. The invention of claim 1, wherein the optoelectronic device is an electro-absorption modulated laser device.

10. An optoelectronic package comprising an optoelectronic device mounted onto a submount, wherein:
    a first wire connects a modulator signal electrode on the submount directly to a modulator contact pad on the optoelectronic device without any intermediate bonding pad relaying; and
    a second wire connects the modulator contact pad to an integrated resistor on the submount, wherein the inductance associated with the first wire is substantially different from the inductance associated with the second wire.

11. The invention of claim 10, wherein the length of the first wire is substantially different from the length of the second wire.

12. The invention of claim 10, wherein the length of the first wire is less than the length of the second wire.

13. The invention of claim 12, wherein the length of the first wire is less than or equal to about 0.45 mm and the length of the second wire is greater than or equal to about 1.2 mm.

14. The invention of claim 13, wherein the length of the first wire is about 0.3 mm and the length of the second wire is about 1.5 mm.

15. The invention of claim 10, wherein the inductance of the first wire is less than the inductance of the second wire.

16. The invention of claim 15, wherein the inductance of the first wire is less than or equal to about 0.45 nH and the inductance of the second wire is greater than or equal to about 1.2 nH.

17. The invention of claim 16, wherein the inductance of the first wire is about 0.3 nH and the inductance of the second wire is about 1.5 nH.

18. The invention of claim 10, wherein the optoelectronic device is an electro-absorption modulated laser device.

* * * * *